(12) United States Patent
Plank

(10) Patent No.: US 12,429,403 B2
(45) Date of Patent: Sep. 30, 2025

(54) SAMPLE TRANSFER DEVICE

(71) Applicant: Leica Mikrosysteme GmbH, Vienna (AT)

(72) Inventor: Heinz Plank, Wiener Neudorf (AT)

(73) Assignee: Leica Mikrosysteme GmbH, Vienna (AT)

( * ) Notice: Subject to any disclaimer, the term of this patent is extended or adjusted under 35 U.S.C. 154(b) by 695 days.

(21) Appl. No.: 17/873,235

(22) Filed: Jul. 26, 2022

(65) Prior Publication Data

US 2023/0039753 A1 Feb. 9, 2023

(30) Foreign Application Priority Data

Aug. 3, 2021 (EP) .................................. 21189461

(51) Int. Cl.
*G01N 1/28* (2006.01)
*G02B 21/00* (2006.01)
*H01J 37/20* (2006.01)
*H01J 37/26* (2006.01)

(52) U.S. Cl.
CPC ............. *G01N 1/28* (2013.01); *H01J 37/20* (2013.01); *G02B 21/00* (2013.01); *H01J 37/26* (2013.01); *H01J 2237/204* (2013.01)

(58) Field of Classification Search
CPC ... G01N 1/28; G01N 1/42; H01J 37/20; H01J 37/26; H01J 2237/204; H01J 2237/201; H01J 2237/2001; G02B 21/00; G02B 21/24
See application file for complete search history.

(56) References Cited

U.S. PATENT DOCUMENTS

| | | | |
|---|---|---|---|
| 8,395,130 B2 * | 3/2013 | Gachter | H01J 37/20 250/311 |
| 10,144,010 B2 | 12/2018 | Lihl et al. | |
| 10,217,603 B2 * | 2/2019 | Lihl | G01N 1/42 |

(Continued)

FOREIGN PATENT DOCUMENTS

| | | | |
|---|---|---|---|
| DE | 4114427 C2 * | 1/1995 | B01L 1/02 |
| EP | 3247987 B1 * | 9/2020 | H01J 37/185 |

(Continued)

OTHER PUBLICATIONS

M.F. Hayles et al., "The making of frozen-hydrated, vitreous lamellas from cells for cryo-electron microscopy," Journal of Structural Biology, vol. 172, Jul. 16, 2010, pp. 180-190.

*Primary Examiner* — David A Vanore
(74) *Attorney, Agent, or Firm* — Hodgson Russ LLP

(57) ABSTRACT

A sample transfer device (100) for receiving a sample inside the sample transfer device (100) and for transferring the sample to a processing or analysing unit includes a connection opening (110) defining a transfer path (114) along which the sample is to be transferred from a loading position (120) of the sample inside the sample transfer device (100) through the connection opening (110), a shutter (130) configured to block the connection opening (110) or to unblock the connection opening (110), and a shielding member (140) configured to be arranged between the connection opening (110) and the loading position (120) to protect the sample from an incoming gas stream when the shutter (130) unblocks the connection opening (110).

19 Claims, 9 Drawing Sheets

(56) References Cited

U.S. PATENT DOCUMENTS

Figure 1:
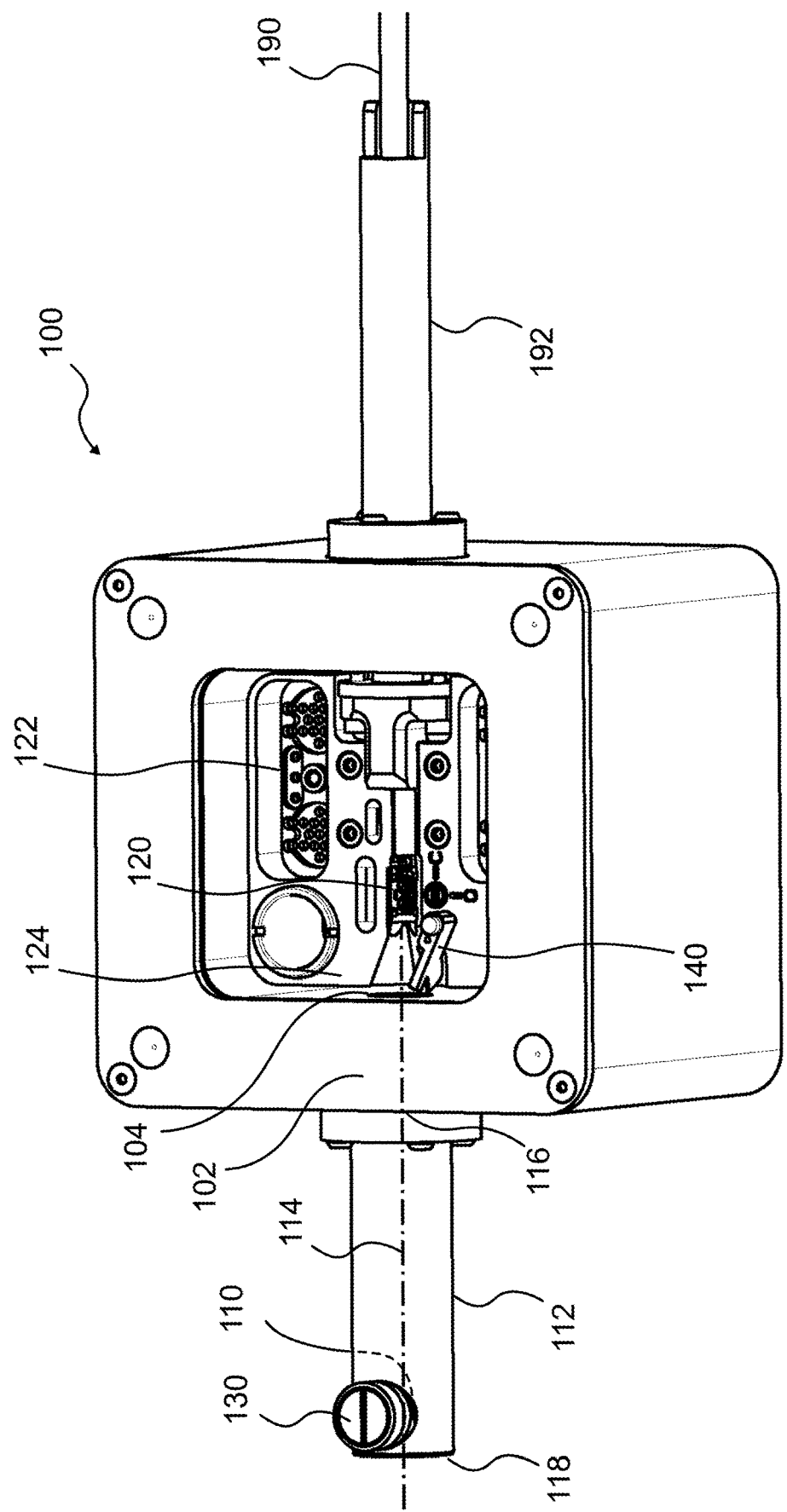

| | | | |
|---|---|---|---|
| 2016/0030941 A1* | 2/2016 | Lihl | B01L 9/00 |
| | | | 422/562 |
| 2017/0370814 A1* | 12/2017 | Gaechter | H01J 37/20 |
| 2020/0379065 A1* | 12/2020 | Mehta | G01R 33/31 |
| 2023/0039753 A1* | 2/2023 | Plank | H01J 37/20 |
| 2024/0112879 A1* | 4/2024 | Bischoff | H01J 37/20 |
| 2024/0274399 A1* | 8/2024 | Maier | H01J 37/30 |

FOREIGN PATENT DOCUMENTS

| | | | | |
|---|---|---|---|---|
| EP | 4047407 A1 * | 8/2022 | | G02B 21/24 |
| EP | 4167013 B1 * | 2/2025 | | H01J 37/20 |
| WO | WO-2006056920 A1 * | 6/2006 | | C12M 33/02 |
| WO | WO-2013099538 A1 * | 7/2013 | | G01N 35/04 |

* cited by examiner

SAMPLE TRANSFER DEVICE

CROSS-REFERENCE TO RELATED APPLICATION

The present application claims the benefit of and priority to European Patent Application No. 21189461.3 filed Aug. 3, 2021, the entire disclosure of which is incorporated herein by reference.

FIELD

The present inventive concept relates to a sample transfer device for receiving a sample inside the sample transfer device and for transferring the sample to a processing or analysing unit. More particularly, the sample transfer device of the present inventive concept is used in the field of cryo-microscopy for transferring a sample to be examined, for instance, to a cryogenic-electron microscope (cryo-EM) or to a cryo-light microscope, or, in another example, for loading and/or manipulating a sample or sample carrier or sample holder inside the sample transfer device and then transferring the sample or sample carrier or holder to another processing unit like a FIB (focused ion beam) setup or to an analysing unit such as a microscope.

BACKGROUND

U.S. Pat. No. 10,144,010 B2 discloses a manipulation container for cryo-microscopy, which manipulation container essentially corresponds to a sample transfer device of the kind discussed above. Cryo-microscopy particularly includes cryo-light microscopy and cryo-electron microscopy.

Cryofixation is a sample preparation method frequently used in cryo-electron microscopy. In it, a water-containing sample is frozen very quickly (cryofixed) to a temperature of less than −150° C., i.e. it is cooled very rapidly in order to avoid the formation of ice crystals. Cryofixation has proven to be particularly suitable for investigations of structural biology. The objects to be investigated, for example cells, enzymes, viruses, or lipid layers, thereby become embedded in a thin, vitrified ice layer. The great advantage of cryofixation is that the biological structures can be obtained in their natural state. For example, a biological process can be halted at any point in time by cryofixation, and investigated in that vitrified state, for example in a cryo-electron microscope but also in a light microscope with corresponding sample cooling; cryo-light microscopy serves principally to locate relevant regions in the sample, which can be noted and then viewed in more detail in a cryo-electron microscope.

The frozen samples, which as a general rule are located on electron-microscope sample carriers known per se, for example a grid or a pin stub mount for scanning electron microscopy, must be conveyed (under the aforesaid cryogenic conditions and with water excluded) into corresponding sample carrier mounts that can subsequently be conveyed in appropriate holders, into the aforesaid microscopes. A typical sample carrier mount for use in connection with the present invention has been disclosed, for example, by the document U.S. Pat. No. 8,395,130 B2, in which a grid that constitutes a sample carrier and carries the frozen sample can be immobilized with clip elements in a corresponding mount.

What have hitherto been used for this are fairly improvised solutions in which liquid nitrogen is stored, for example, in a Styrofoam container in which the requisite manipulation steps for conveying the grid into the sample carrier mounts were performed. The formation of cryogenic nitrogen gas from the liquid nitrogen on the one hand ensures the necessary low temperature and on the other hand creates an anhydrous atmosphere in the Styrofoam container, so that contamination of the samples with water, and consequently with ice crystals, could be prevented.

In order not to impair the quality of the frozen samples, it is very important that they be transferred in cooled and contamination-free, particularly water-free, fashion between the processing units being used, for example the cryofixation device, freeze fracture apparatus, and coating apparatus, and the analytical devices, in this case principally a cryo-light microscope and cryo-electron microscope. For this as well, in everyday laboratory practice is has hitherto been usual to resort to fairly improvised solutions or to specifically fabricate loading and transfer systems in-house.

As already pointed out above, the samples to be examined need to be processed constantly under cryogenic conditions. Contamination or devitrification reduce dramatically the success rate of the workflow. In order to identify the region of interest before starting the time-consuming and expensive cryogenic-electron microscopy (cryo-EM) step (such as scanning electron cryo-microscopy (CryoSEM), transmission electron cryo-microscopy (CryoTEM) or electron cryotomography (CryoET)), cryo-light microscopy is typically applied. By using the cryo-light microscopy, a region of interest in the nanometre range can be identified within a cell volume (millimetre range). The region of interest is then retraced in the cryo-EM such that the analysing process is highly accelerated. To this end, the light microscope, at least the light microscope stage, has to be used under cryogenic conditions. The samples, typically on a sample carrier, are loaded into a sample transfer device, also known as cryo-CLEM ("cryo-light-electron-microscopy") shuttle and then transferred into the cryo-stage of the light microscope. Connection of the sample transfer device to the cryo-stage and transfer of the sample into the cryo-stage involve a high risk of contamination.

While certain applications have been discussed above, other applications can be envisaged where a sample or a sample carrier or a sample holder needs to be transferred from a sample transfer device to another processing or analysing unit.

SUMMARY

An object of the present inventive concept is to provide a sample transfer device, the use of it minimizing the risk of contamination or devitrification of a sample transferred by that sample transfer device of the kind discussed above to a processing or analysing unit.

The present inventive concept provides a sample transfer device according to claim 1. The sample transfer device for receiving a sample and/or a sample carrier and/or sample holder ("sample" in this context is meant to include a sample carrier and/or a sample holder) inside the sample transfer device, more particularly inside a chamber of the sample transfer device, and for transferring the sample from inside the sample transfer device to a processing or analysing unit outside the sample transfer device, comprises: a connection opening defining a transfer path along which the sample is to be transferred from a loading position of the sample inside the sample transfer device through the connection opening, particularly to a transfer position of the sample. The sample and/or sample carrier and/or sample holder, in use, is first loaded in the sample transfer device, more particularly in the chamber of the sample transfer device at a predetermined position, the so-called "loading position"; the chamber is typically held at cryogenic temperatures, e.g. by filling a part of the chamber with liquid nitrogen. From there, the sample is then transferred along a transfer path through the connection opening of the sample transfer device. After having reached a transfer position, the sample is transferred to a processing or analysing unit, for instance, a cryo-light microscope stage. Further, the sample transfer device comprises a shutter configured to block the connection opening or to unblock the connection opening. This shutter serves the purpose of blocking the connection opening as long as the sample and/or sample carrier and/or sample holder is manipulated and/or loaded inside the sample transfer device. The shutter unblocks the connection opening in order to enable the transfer of the sample to a processing or analysing unit. The sample transfer device further comprises a shielding member configured to be arranged (in an active position) between the connection opening and the loading position to protect the sample from an incoming gas stream when the shutter unblocks the connection opening.

When the shutter unblocks the connection opening to enable transfer of the sample, there is a high risk of contamination or devitrification of the sample in its loading position and/or during its way to the transfer position. Opening the shutter, i.e. unblocking the connection opening, leads to an incoming gas stream, which may directly hit the sample in its loading position and/or on its way to the transfer position. E.g. gaseous nitrogen from the cryo-stage (or another unit) and/or warm air inside a connection tube is pushed towards the sample, which acts as a cold trap such that humidity is accumulated and frozen on the sample surface. Contamination of the sample by water with the consequence of ice crystals being formed on the sample or devitrification due to an increase of temperature may be the result. In order to avoid such risks, the sample transfer device of the present inventive concept comprises a shielding member which protects the sample from incoming gas streams when the shutter is opened to unblock the connection opening. The shielding member is arranged between the connection opening itself and the loading position of the sample. As such, the shielding member may or may not block the transfer path of the sample and/or the sample holder. On the one hand, the shielding member can have a recess, which recess, seen from the direction of the transfer path, preferably lines up precisely with the cross section of the sample holder such that any incoming gas stream is deflected by a front surface formed by the shielding member together with the sample holder. On the other hand, the shielding member in its active position can cover the sample holder and block the transfer path to protect the sample from any incoming gas stream. In the first embodiment, after the incoming gas stream has dissolved, the sample/sample holder can be transferred through the recess of the shielding member to the transfer position. In the second embodiment, the shielding member will have to be moved out of the transfer path after the incoming gas stream has dissolved in order to make a transfer of the sample to the transfer position possible.

In an embodiment, the shielding member is configured to assume a first and a second position. In its first position, the shielding member releases the transfer path and, in its second position, the shielding member blocks the transfer path. In this embodiment, the shielding member, in its second position, blocks the transfer path and obstructs any access into the connection opening as seen from the sample, and, vice versa, shields the sample from any incoming gas stream through the connection opening. Such an incoming gas stream is deflected at a shielding member surface facing the connection opening and directed into other directions such that the gas stream cannot reach the sample directly. In use, after the sample having been loaded into its loading position inside the sample transfer device, the shielding member being in its second position, the shutter can be opened to unblock the connection opening and then, after a short time period, after the incoming gas stream has vanished, the sample can be transferred to its transfer position. In order to do so, the shielding member is brought in its first position such that it releases the transfer path.

The movement of the shielding member between the first and the second positions, can be performed automatically and/or manually. For example, if the shutter is opened to unblock the connection opening, the shielding member should always assume its second position. The corresponding coupling may be implemented electromechanically or by a mechanical forced coupling. This movement may, however, be also done manually, e.g. by a pair of tweezers. In order to be able to move the sample from its loading position to the transfer position, the shielding member has to be brought into its first position where the shielding member releases the transfer path. Again, this movement may be performed manually or automatically. For instance, a movement of the sample and/or the sample holder along the transfer path may be detected, and upon its detection, the shielding member may be brought into its first position by electromechanical interaction. Alternatively, a forced coupling or a manual adjustment can be used instead. It is, however, also possible to simply push the shielding member from its second position into its first position by exerting a pushing force onto the shielding member, e.g. by the moving sample holder along the transfer path.

The sample transfer device according to the present inventive concept, preferably has a connection opening which is formed by or is at least part of an inside of a connection tube, the transfer path extending through the connection tube. As already discussed above, the connection opening of the sample transfer device defines the transfer path along which the sample/sample holder is to be transferred from its loading position to a transfer position through the connection opening. At its transfer position, the sample/sample carrier/sample holder is transferred to a processing or analysing unit, such as a cryo-microscope stage. For reasons of practicability, the sample transfer device comprises a connection tube, the tip of which is introduced into a corresponding socket of the processing or analysing unit and may be connected to it. Afterwards, the shutter is opened to unblock the connection opening and to enable transport of the sample/sample holder along the transfer path if the shielding member is in its first position. In such an embodiment, the connection opening is formed by the inside of the connection tube or is part of the inside of the connection tube; alternatively, in this case the connection opening may be defined as the opening which is blocked or unblocked by the shutter. In the latter case, the connection opening is the part of the inside of the connection tube where the shutter is located.

In the embodiment where the sample transfer device comprises a connection tube, the inside of the connection tube often still comprises an atmosphere which is different from the atmosphere inside the sample transfer device, e.g. in the chamber of the sample transfer device where the sample is manipulated and/or loaded into its loading position. The atmosphere inside the connection tube may be of a higher temperature and a higher humidity than the atmosphere in the sample transfer device chamber. Thus, after opening the shutter, this warm and humid atmosphere forms an incoming gas stream which hits the sample resulting in a risk of contamination and devitrification. This risk can be minimized by the shielding member which is preferably arranged between an inside end of the connection tube and the loading position of the sample. Typically, the inside end of the connection tube is formed in a wall of the chamber of the sample transfer device, where the sample is manipulated and/or loaded.

In an embodiment, where the shielding member is configured to assume a first and a second position, it is preferable if the shielding member is configured such that, in its second position, the shielding member fixes the sample in the loading position. Again, the term "sample" is used equivalently to "sample carrier" or "sample holder". Thus, in this embodiment, the shielding member serves fixing the sample and/or sample carrier and/or the sample holder in the loading position, facilitating any manipulation of the sample or sample carrier or loading the sample holder into the loading position. This fixing function was previously fulfilled by a pushing element or "pusher", which had to be removed before transferring the sample holder to the transfer position. This pusher was located at a side of the sample holder turned away from the connection opening. After loading, the sample, typically placed on a sample grid, was put into the sample holder, typically a sample cartridge, in the loading position and was only fixed by the pushing element/pusher. This pusher can now be omitted as the sample holder/cartridge, and thus the sample itself, can be fixed in the loading position by means of the shielding member which is arranged at the connection opening side such that it holds the sample holder in its loading position.

In an embodiment, the shielding member is pivotably mounted on a rotation axis. This embodiment easily enables the shielding member to assume two different positions (or even more), especially in order to block the transfer path and shield the sample or release the transfer path. It is preferred if the rotation axis is oriented in a direction perpendicular to the direction of the transfer path. Corresponding embodiments will be explained in further detail below in connection with the figures. It should be noted that the shielding member might work as a door, which can be hinged aside in order to release the transfer path, or work as a lid, which can be hinged up and down in order to release and block the transfer path, respectively.

It is preferable if the shielding member is held in at least one of said first and second positions by magnetic forces. In this embodiment, the shielding member may carry a magnet, while two other magnets may be arranged at the sample transfer device such that the corresponding magnets are operatively connected as soon as the shielding member reaches the first and the second position, respectively. Such a magnetic arrangement easily helps define first and second positions of the shielding member.

In another embodiment, the shielding member comprises a surface facing the connection opening of the sample transfer device, which surface particularly comprises a flow profile for deflecting the incoming gas stream. In general, the surface facing the connection opening serves the purpose of deflecting any incoming gas stream by guiding the incoming gas stream into directions different from the direction to the sample itself. This effect can be improved by a flow profile of the surface, which is hit by the incoming gas stream.

In an embodiment of the sample transfer device, the sample transfer device comprises a transfer rod configured to receive a sample holder carrying the sample and being movable in the direction of the transfer path. As already discussed above, typically a sample holder/cartridge is inserted in the loading position of the sample transfer device. Then, according to a preferred embodiment of the present inventive concept, the shielding member is moved into its second position such that it blocks the transfer path and protects a sample placed in the sample holder and, at the same time, fixes the cartridge in the loading position. A sample, particularly one or two sample grids, is placed on the sample holder/cartridge. In order to move the sample holder from the loading position to a position where the sample can be transferred into a processing or analysing unit, a transfer rod is connected to the sample holder/cartridge, which can be moved by movement of the transfer rod. Generally, the transfer rod is configured to receive the sample holder or to be connected with the sample holder and is movable in the direction of the transfer path in order to move the sample holder from the loading position to a transfer position of the sample. In order to facilitate an easy and precise movement of the transfer rod, the sample transfer device typically comprises another tube, particularly at the opposite side of the connection tube of an embodiment discussed above, which second tube guides the transfer rod.

It is preferred if the tip of the transfer rod is configured to receive the sample holder. In order to connect the transfer rod with the sample holder, the sample holder preferably comprises a (second) borehole to receive a tip portion of the transfer rod.

In another preferred embodiment, the transfer rod comprises a protective cover configured to be placed above the sample located in the sample holder when the sample holder receives or is connected to the transfer rod. Preferably, when pushing the transfer rod in the (second) borehole of the sample holder, the protective cover moves above the sample located in the sample holder such that, when the transfer rod is connected to the sample holder, the protective cover covers the sample or the samples in the sample holder. This protective cover thus provides an additional protection of the sample(s) from any contamination. Especially in case of any turbulence of the incoming gas stream, the protective cover prevents that a part of the incoming gas stream hits the sample(s) from above.

It is preferred if a height of the shielding member in its position of protecting the sample from an incoming gas stream is at least equal to a height of the protective cover. The respective heights relate to the same basis in the sample transfer device. This embodiment ensures that an incoming gas stream is not guided beneath the protective cover but above the protective cover.

In an embodiment, the sample holder comprises a sample holding area for receiving the sample and/or a sample carrier, and one or more (first) boreholes extending through the sample holder in line with the sample holding area. Accordingly, a sample/sample grid can be placed on the corresponding sample holding area. The corresponding (first) boreholes might for example enable transmission-light or transmission-electron microscopy or other microscopic techniques after the sample holder has been transferred to the corresponding microscope as an analysing unit.

As already discussed above, it is preferred if the sample holder comprises another (second) borehole. In particular, the transfer rod and/or the second borehole are configured such that the transfer rod is at least partly mounted to or incorporated into the second borehole when the sample and thus the sample holder is in the loading position, for moving the sample holder along the transfer path.

Furthermore, it is preferred if the second borehole of the sample holder is covered by the shielding member when in the corresponding active position to protect the sample from an incoming gas stream, particularly in its second position. This avoids that incoming gas enters the second borehole and from there being scattered through the inside of the sample transfer device.

It should be noted that the above features of the embodiments of the inventive concept can—wholly or in part—be combined to achieve other embodiments still falling under the scope of the present inventive concept as defined in the appended claims.

As used herein, the term "and/or" includes any and all combinations of one or more of the associated listed items and may be abbreviated as "/".

Although some aspects have been described in the context of an apparatus or device, it is clear that these aspects also represent a description of a method of operating such an apparatus or device.

Further embodiments and advantages of the present inventive concept are described below in connection with the following figures.

SHORT DESCRIPTION OF THE FIGURES

Figure 2:
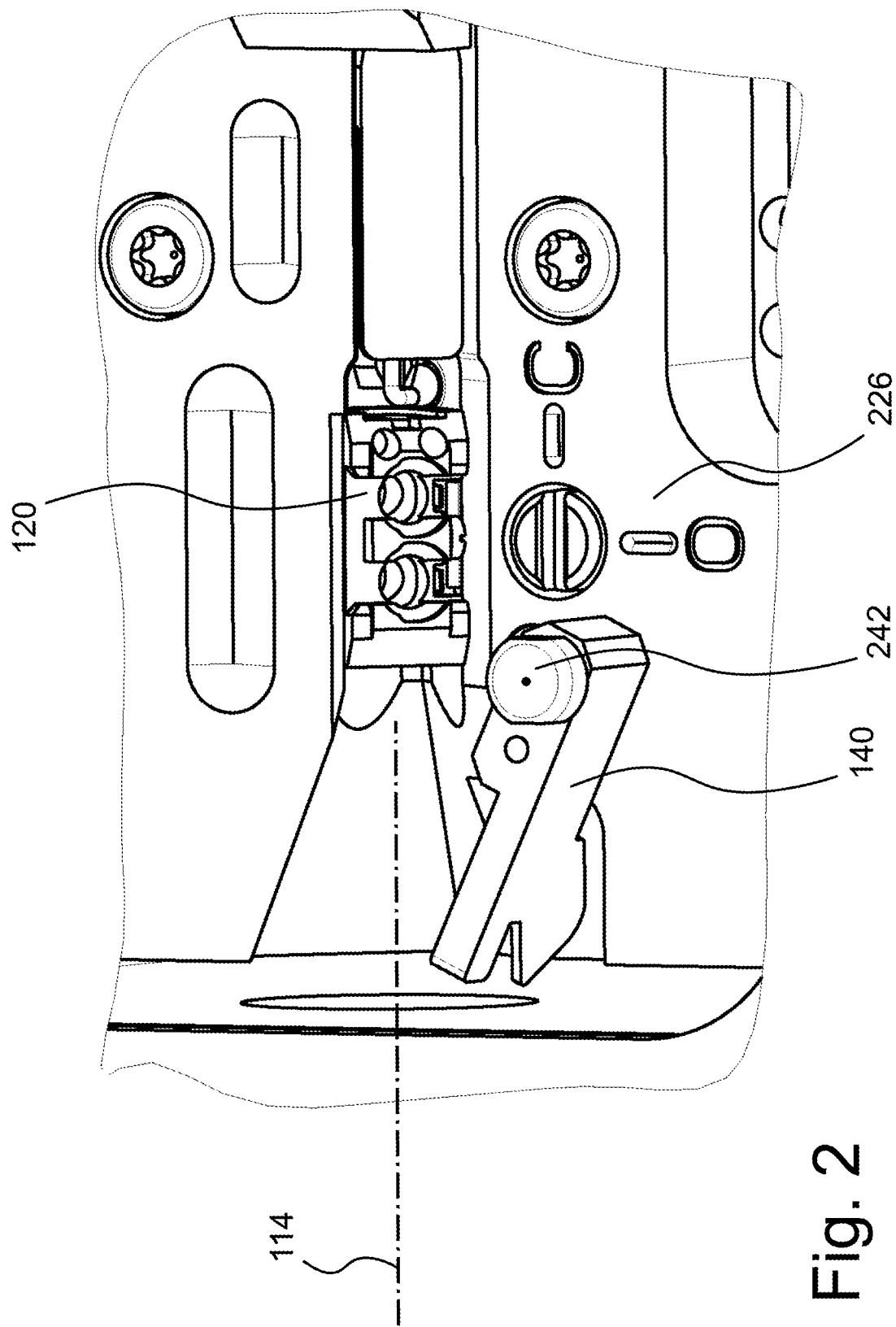
Figure 3:
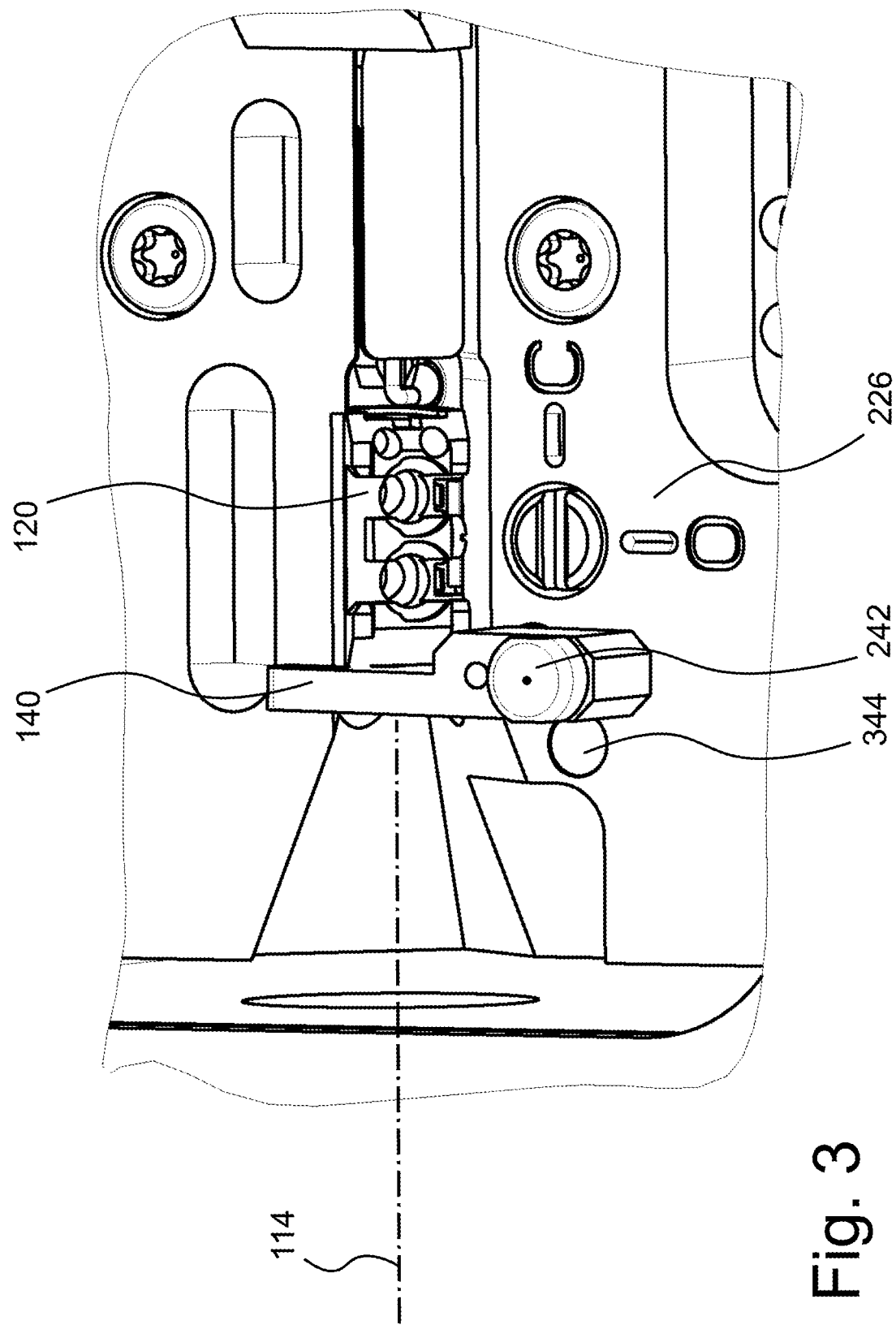
Figure 4:
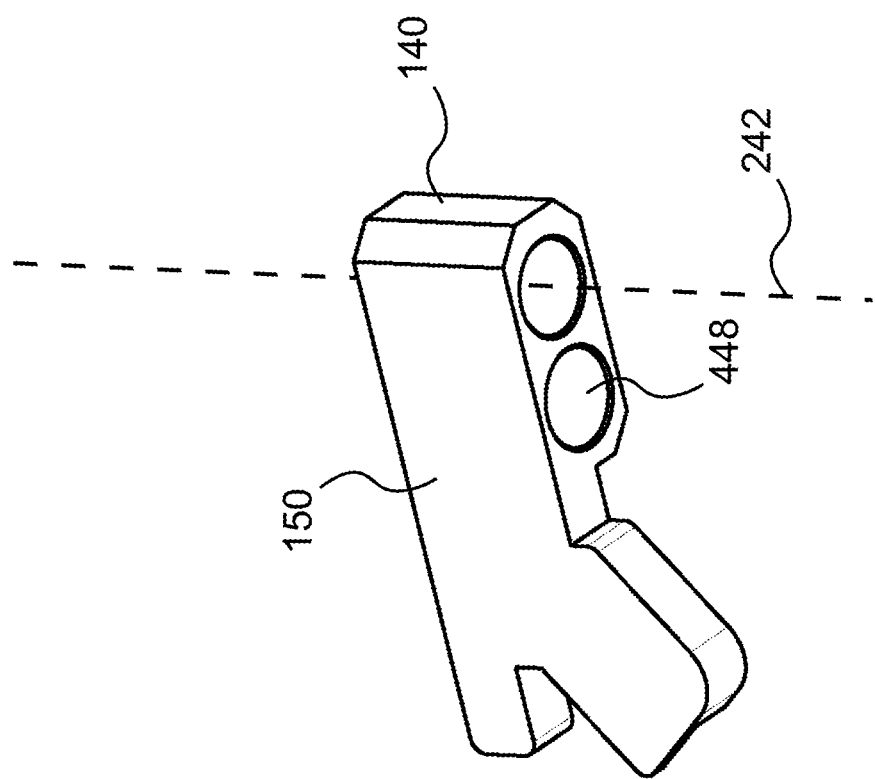
Figure 5:
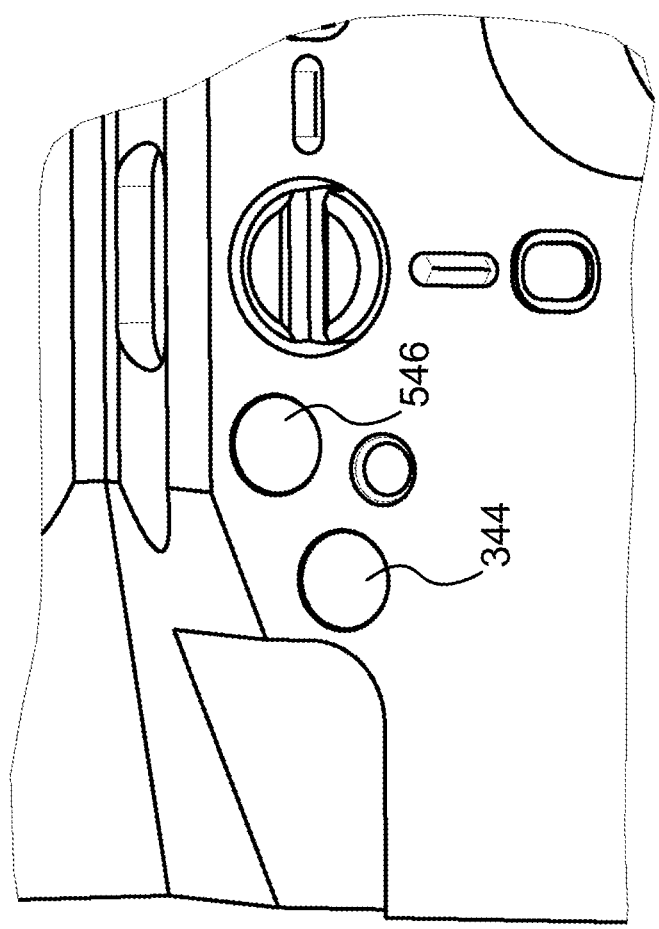
Figure 6:
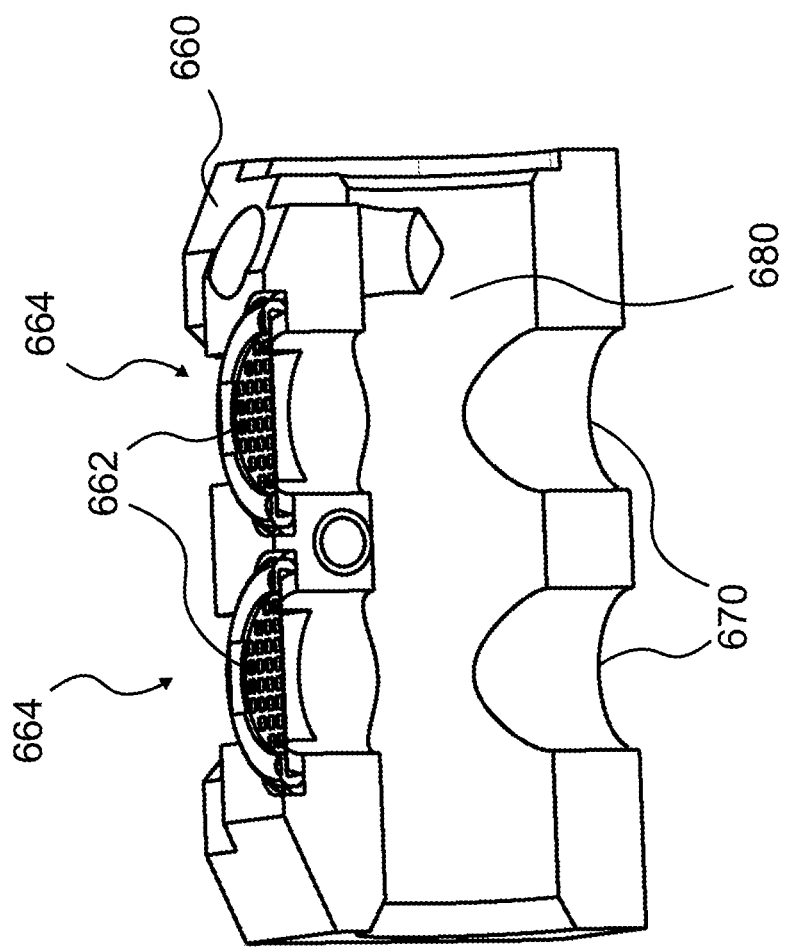
Figure 7:
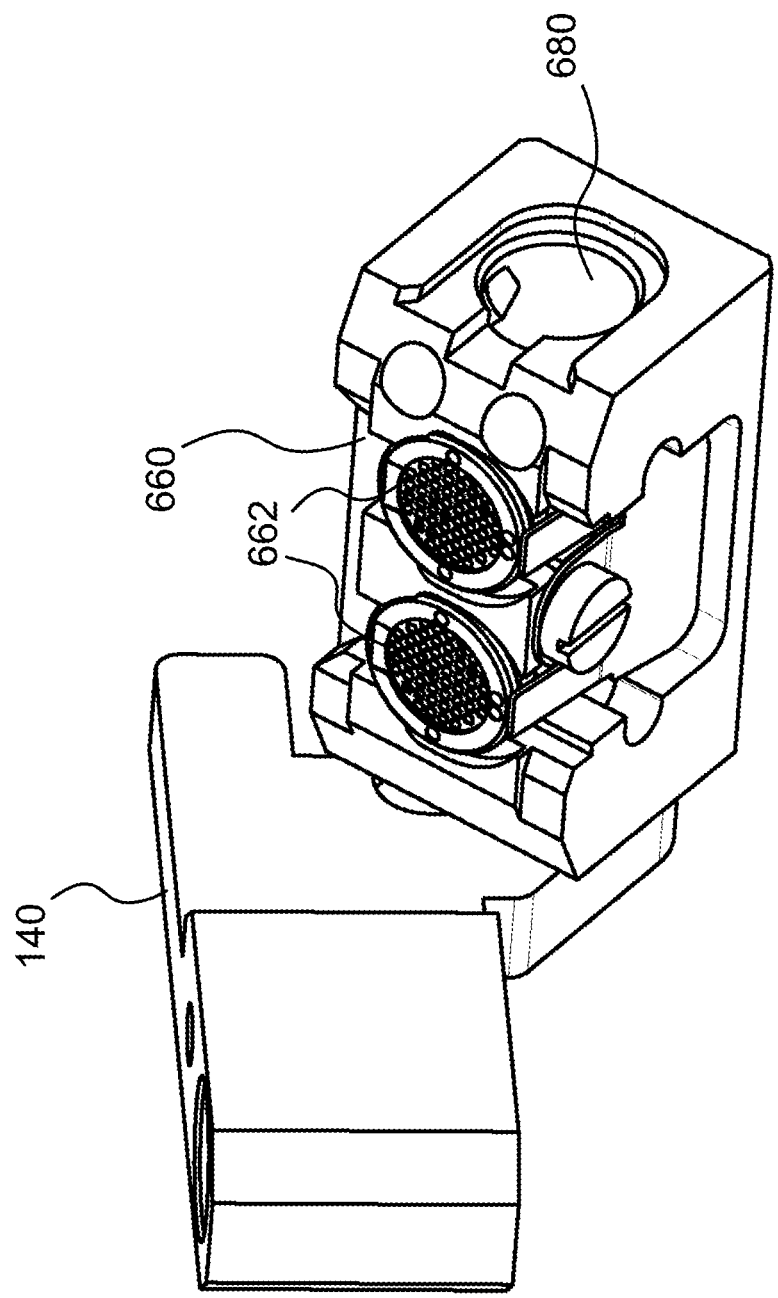
Figure 8:
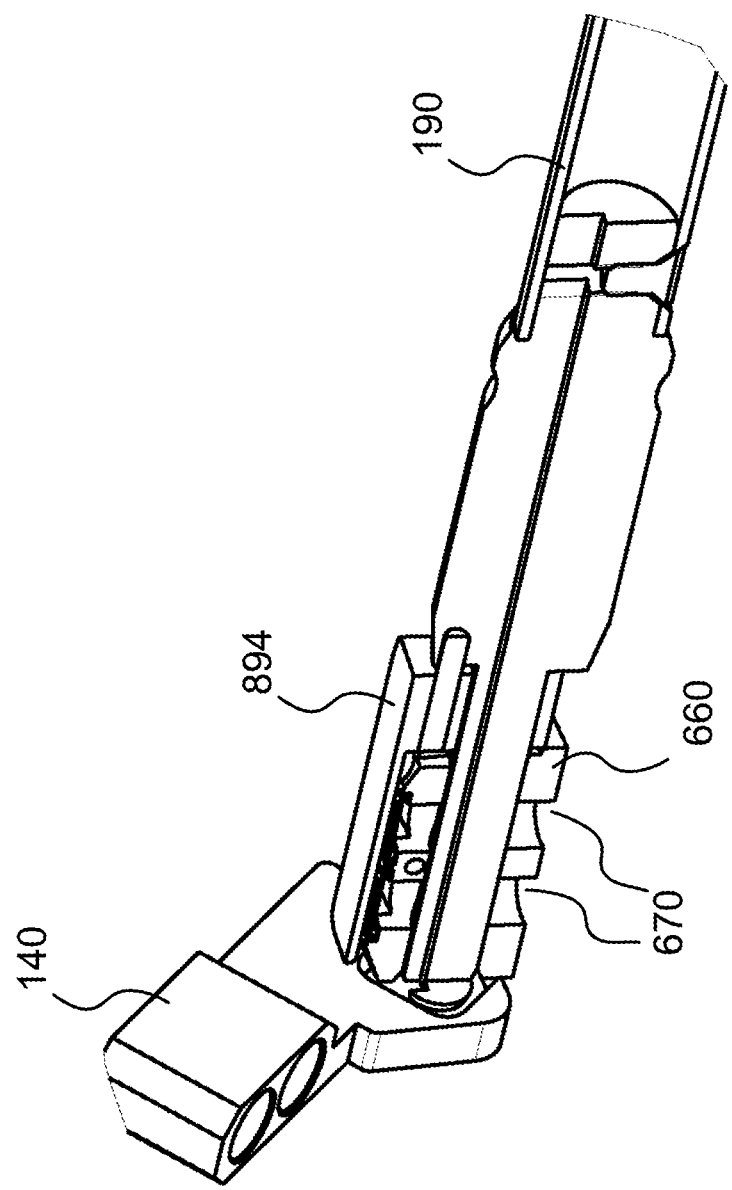
Figure 9:
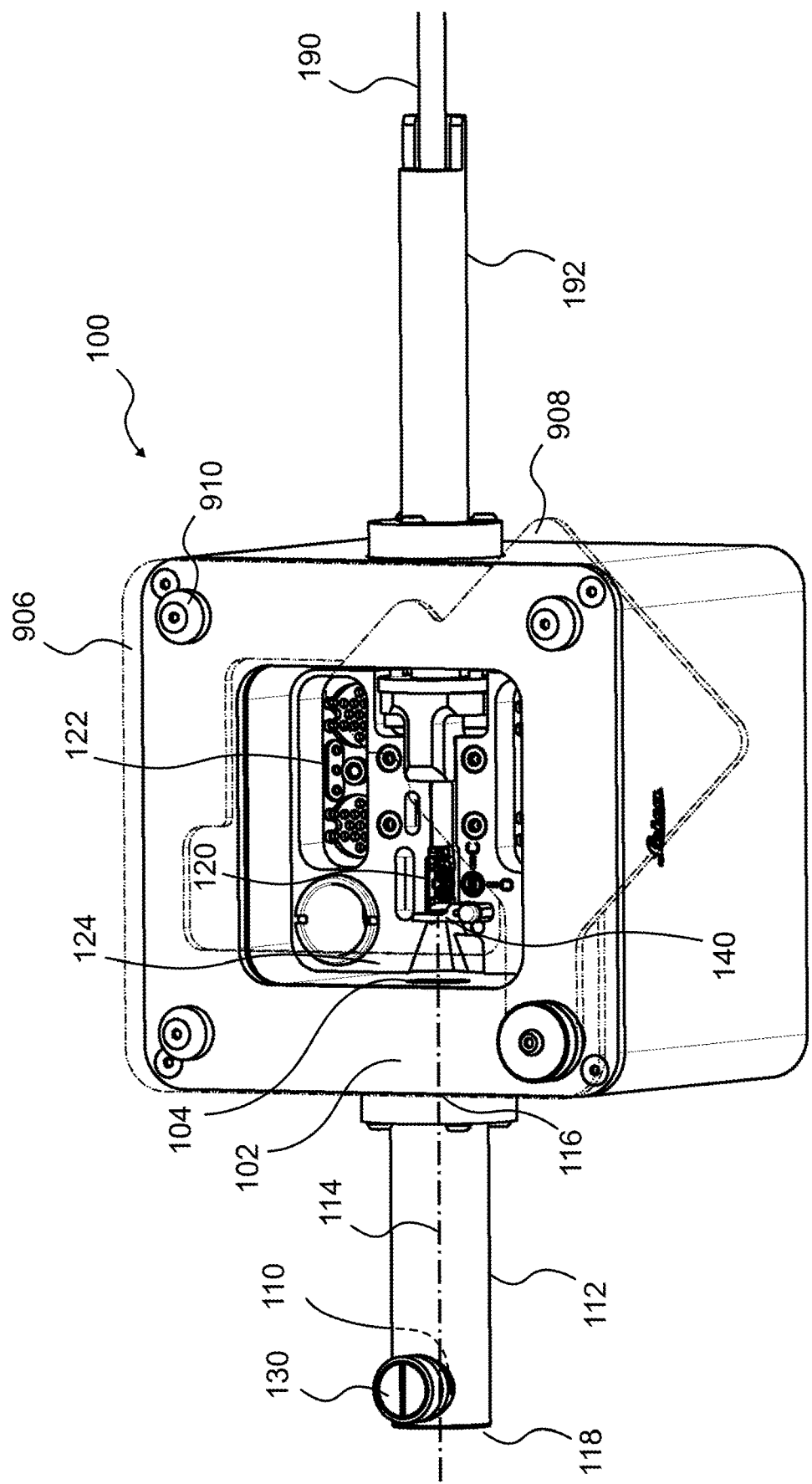

FIG. 1 schematically shows an embodiment of a sample transfer device according to the present inventive concept, FIG. 2 schematically shows a detail of the embodiment of FIG. 1, the shielding member being in a first position, FIG. 3 schematically shows a detail corresponding to the detail of FIG. 2, the shielding member, however, being in its second position, FIG. 4 schematically shows a perspective view of the shielding member from below, FIG. 5 schematically shows the corresponding part of the basis of the sample transfer device configured to receive a shielding member as shown in FIG. 4, FIG. 6 schematically shows a perspective cross-sectional view of a sample holder which may be used in a sample transfer device of the present inventive concept, FIG. 7 schematically shows a detail including a shielding member in its active position together with a sample holder in a loading position, FIG. 8 schematically shows another detail of a shielding member in its active position together with a sample holder, and a transfer rod partly received by the sample holder and providing a protective cover placed above the sample holder, and FIG. 9 schematically shows another embodiment of a sample transfer device according to the present inventive concept.

DETAILED DESCRIPTION

In the following, the figures are described comprehensively, same reference signs designating same or at least structurally identical components.

FIG. 1 schematically shows a sample transfer device 100 for receiving a sample (not yet shown, see below for further explanations) inside the sample transfer device 100 and for transferring the sample to a processing or analysing unit, for instance, a cryofixation device, a freeze fracture apparatus, a coating apparatus as processing units, or a cryo-light microscope or a cryo-electron microscope as examples of an analysing unit. It should be noted that a sample, typically a biological sample, is typically placed on a sample carrier (like a sample grid), and the sample carrier is put on a sample holder, also called sample cartridge. Thus, any reference to a "sample" should equivalently be understood as a reference to a "sample carrier" and/or "sample holder".

The sample transfer device 100 of FIG. 1 comprises a connection opening 110 defining a transfer path 114 along which the sample is to be transferred from a loading position 120 of the sample/sample holder inside the sample transfer device, first to the connection opening 110 and then to a transfer position of the sample, which transfer position typically being outside of the sample transfer device 100. In order to get to the transfer position, the transfer path needs to be unblocked, i.e. the shutter 130 needs to release the connection opening 110.

In the embodiment of FIG. 1, the shutter 130 and the connection opening 110 are arranged near the end of a connection tube 112. Shutter 130 and connection opening 110 may, however, be arranged at any position along the connection tube 112 or at an inside end 116 of the connection tube 112 or even in a wall 102 of the sample transfer device 100 on the transfer path 114 or at an inner side 104 of an opening in the wall 102 leading to the connection tube 112.

A shielding member 140 is arranged between the connection opening 110, more particularly between an inside end 116 of the connection tube 112, and even more particularly between the inner side 104 of an opening in a wall 102 of the sample transfer device, the opening being connected with the connection tube 112, and the loading position 120 to protect the sample from an incoming gas stream when the shutter 130 unblocks the connection opening 110. The corresponding arrangement of the shielding member 140 to enable its function of shielding the sample from an incoming gas stream is shown in FIG. 3 in more detail. The embodiment of FIG. 1 shows the shielding member 140 in a first inactive position where the shielding member releases the transfer path 114.

FIG. 1 further shows a transfer rod 190 which will be discussed further below and which serves as a transport means for transferring a sample holder loaded in loading position 120 along the transfer path 114 to the outside end 118 of the connection tube 112. To this end, transfer rod 190 is mounted in a transfer rod tube 192 in which the transfer rod 190 can be moved in its axial direction.

The inside of the sample transfer device, which includes the loading position 120 forms a chamber 124 where preferably a cryogenic atmosphere is present while a sample/sample carrier/sample holder is manipulated and/or mounted in the loading position and/or transferred to the transfer position. The cryogenic atmosphere inside chamber 124 can be generated by filling a part of the chamber 124 with liquid nitrogen. The liquid level of liquid nitrogen typically reaches to a level below the basis of the sample transfer device, the loading position 120 being on this basis. The basis is designated 226 and shown in more detail in FIGS. 2, 3, and 5.

Reference 122 depicts an area where a sample on a sample carrier/grid can be manipulated or an area where a sample carrier/grid can be taken from and placed on a sample holder/cartridge. It can, however, also be an area where a sample holder/cartridge can be placed and a sample/sample carrier can be transferred from outside the sample transfer device 100 into the sample holder located in the area 122. To allow such types of action, a preferably transparent cover (shown in FIG. 9 in more detail) covering the chamber 124 or a part of such a cover is partly opened by shifting it away for exposing corresponding regions of access. Users always take care that the exposed region is as small as possible in order to avoid destruction of the cryogenic atmosphere.

FIG. 2 schematically shows a detail of the inside of the sample transfer device 100 of FIG. 1. As can be seen from FIG. 2, the shielding member 140 is in its first position releasing the transfer path 114. In this position, a sample holder/cartridge can be transferred from the loading position 120 along the transfer path 114 through the connection opening 110 to a transfer position of the sample outside the sample transfer device 100. The shielding member 140 is pivotably mounted on a rotation axis 242 such that the shielding member 140 can be pivoted from an inactive (first) position to an active (second) position which is shown in FIG. 3.

FIG. 3 shows the same detail as FIG. 2 with the shielding member 140 being in its active (second) position. In this position, the shielding member 140 blocks the transfer path 114 as can be seen from FIG. 3. Further, in the position shown, the shielding member 140 fixes a sample holder/cartridge in the loading position 120, and thus also fixes the sample in the loading position 120. It is preferred if the shielding member 140 is held in its active and inactive positions, respectively, by magnetic forces. To this end, a magnet 344 is provided in the basis 226 of the sample transfer device 100. Another magnet 546 (see FIG. 5) is placed at a position corresponding to the active position of the shielding member 140 in the basis 226 of the sample transfer device 100. Operation of the magnets will be described in connection with the FIGS. 4 and 5.

FIG. 4 schematically shows a shielding member 140 in a perspective view seen from below. The shielding member 140 has a surface 150 facing the inner side 104 of wall 102 of the sample transfer device 100, thus facing an incoming gas stream. Further, the shielding member 140 comprises a borehole in the direction of the rotation axis 242 for mounting the shielding member 140 onto the basis 226 of the sample transfer device 100. Further, as can be seen from FIG. 4, the shielding member 140 comprises a magnet 448 which can be magnetically connected to each of the two magnets 344 and 546 in the basis 226 of the sample transfer device 100. These two magnets 344 and 546 are shown in FIG. 5. When the shielding member 140 is pivoted into its first position, the shielding member 140 is fixed by magnetic forces between magnet 448 and magnet 344. When pivoted in its second position, the shielding member 140 is fixed by magnetic forces between the magnet 448 and the magnet 546. The surface 150 may have a profile for directing a gas stream hitting the surface 150 into preferred directions away from the sample behind.

FIG. 6 schematically shows an embodiment of a sample holder 660 which is configured to be placed into the loading position 120 of a sample transfer device 100 as shown in FIG. 1. The sample holder 660 or sample cartridge in this embodiment comprises two sample holding areas 664 configured to receive sample carriers 662, in this case sample grids. The sample is placed on the sample grid 662. Two first boreholes 670 extend through the sample holder 660 in line with the corresponding sample holding area 664 such that samples to be examined can be imaged by a transmitted-light or a transmitted-electron microscope. In addition to the two first boreholes 670, another second borehole 680 extends perpendicularly to the directions of the two first boreholes 670 through the sample holder 660. This borehole 680 is configured to receive a tip part of the transfer rod 190. The transfer rod 190 can be connected to the sample holder 660 such that by axial movement of the transfer rod 190 the sample holder 660 is moved along the transfer path 114. This allows a sample on a sample carrier 662 to be moved from the loading position 120 through the connection opening 110 to a transfer position outside of the sample transfer device 100.

FIG. 7 shows an embodiment for illustrating the arrangement of the shielding member 140 in relation to a sample holder 660, for instance, the sample holder 660 of FIG. 6. In the arrangement shown in FIG. 7, the shielding member 140 is in its active (second) position, and the shielding member 140 is formed such that it is able to cover the second borehole 680 of the sample holder 660, when the shielding member 140 is arranged in its active (second) position. In this embodiment, the shielding member 140 not only protects a sample on the sample carrier 662 from an incoming gas stream, but also prevents an incoming gas stream from entering the borehole 680, which would otherwise reach the first boreholes 670 and thus the sample and/or the inside of the sample transfer device 100 through borehole 680.

In an exemplary operation, the shielding member 140 is in its inactive (first) position, and the sample holder 660 can be inserted in the loading position 120. For instance, with a tool like a pair of tweezers, the shielding member 140 is moved to the right side in its active (second) position where it is held by magnetic forces as explained above. In this position, the sample holder 660 is fixed in the loading position (see FIG. 3) and the samples can be inserted. The sample transfer device 100, also called shuttle, can now be attached to a processing or analysing unit, for instance the cryo-stage of a cryo-microscope. Next, the shutter 130 is opened in order to unblock the transfer path 114. Opening the shutter 130 enables any gas present in the connection line to be sucked into the inside of the sample transfer device 100. However, the shielding member 140 in its active position protects the samples on the sample holder 660 by deflecting an incoming gas stream. At the same time, as shown in FIG. 7, the shielding member 140 prevents gas from entering the borehole 680 of the sample holder 660 illustrated in FIGS. 6 and 7. With the shielding member 140 of the present inventive concept, humidity in the incoming gas stream cannot condensate on the samples thus preventing any contamination. After a predetermined time period, the shielding member 140 is moved into its inactive (first) position, for instance, by moving the sample holder 660 by means of the transfer rod 190 towards the connection opening 110, thus pushing the shielding member 140 into its first position where it is held by magnetic forces.

FIG. 8 shows another preferred embodiment showing a position where the transfer rod 190 is connected to the sample holder 660 and the shielding member 140 being in a position as shown in FIG. 7. As can be seen from FIG. 8, the transfer rod 190 (shown in its longitudinal section) comprises a protective cover 894 configured to be placed above the sample carried by the sample holder 660 when the sample holder 660 is receiving the transfer rod. When moving the transfer rod 190 into the second borehole 680 of the sample holder 660, the protective cover 894 moves above the sample carriers 662 located in the sample holder 660. The protective cover 894 provides an additional protection of the samples from any gas streams from above. It is preferred if, as shown in FIG. 8, a height of the shielding member 140 is at least equal to or higher than a height of the protective cover 894, the respective heights relating to the same basis 226 in the sample transfer device 100. In this way, even the protective cover 894 is protected by the shielding member 140 such that any incoming gas streams are led in an area above the protective cover 894.

FIG. 9 shows another embodiment of a sample transfer device 100, which essentially corresponds to the one shown in FIG. 1. Thus, reference is made to the discussion of FIG. 1 above, and only the differences to this embodiment are discussed in the following. As can be seen from FIG. 9, the sample transfer device 100 of FIG. 1 comprises a transparent cover 906 mounted by means of four support legs 910 to the frame of the sample transfer device 100. Vaporized inert/nitrogen gas can escape from the interior of the sample transfer device 100 through a gap between the frame and the transparent cover 906 such that the interior is held under a slight over pressure and outside air is prevented from entering the inside.

While, in principle, user access to the interior may be provided by opening/removing, at least partly, the transparent cover 906, it is preferred if the transparent cover 906 comprises a transparent lid 908 which can be, at least partly, opened to provide such a user access. In the embodiment shown, the transparent lid 908 is pivotably mounted to one of the support legs 910. By this, atmospheric disturbance can be minimized when loading/manipulating a sample from outside the sample transfer device 100.

As shown in FIG. 9, a shielding member 140 is arranged between the connection opening 110, more particularly between an inside end 116 of the connection tube 112, and even more particularly between the inner side 104 of an opening in the wall 102 of the sample transfer device and the loading position 120 to protect the sample from an incoming gas stream when the shutter 130 unblocks the connection opening 110. The embodiment of FIG. 9 shows the shielding member 140 in its second active position. Regarding further details as to the elements and their function of the sample transfer device 100, reference is made to FIG. 1 above.

LIST OF REFERENCE SIGNS 100 sample transfer device
102 wall
104 inner side of wall
106 cover
110 connection opening
112 connection tube
114 transfer path
116 inside end of connection tube
118 outside end of connection tube
120 loading position
122 area
124 chamber
130 shutter
226 basis
140 shielding member
242 rotation axis
344 magnet
546 magnet
448 magnet
150 surface
190 transfer rod
192 transfer rod tube
660 sample holder
662 sample carrier
664 sample holding area
670 first borehole
680 second borehole
894 protective cover
906 transparent cover
908 transparent lid
910 support leg

What is claimed is:

1. A sample transfer device for receiving a sample inside the sample transfer device and for transferring the sample to a processing or analysing unit, the sample transfer device comprising:
   a connection opening defining a transfer path along which the sample is to be transferred from a loading position of the sample inside the sample transfer device through the connection opening;
   a shutter operable to selectively block the connection opening and unblock the connection opening; and
   a shielding member arranged between the connection opening and the loading position and configured to protect the sample from an incoming gas stream when the shutter unblocks the connection opening.

2. The sample transfer device of claim 1, wherein the shielding member is configured to assume a first position and a second position, wherein, in the first position, the shielding member releases the transfer path, and, in the second position, the shielding member blocks the transfer path.

3. The sample transfer device of claim 2, wherein the shielding member fixes the sample in the loading position when the shielding member is in the second position.

4. The sample transfer device of claim 2, wherein the shielding member is held in at least one of the first position and the second position by magnetic force.

5. The sample transfer device of claim 2, wherein the shielding member comprises a surface facing the connection opening of the sample transfer device when the shielding member is in the second position.

6. The sample transfer device of claim 5, wherein the surface of the shielding member has a flow profile for deflecting the incoming gas stream.

7. The sample transfer device of claim 1, wherein the connection opening is formed by or is at least part of an inside of a connection tube, the transfer path extending through the connection tube.

8. The sample transfer device of claim 7, wherein the shielding member is arranged between an inside end of the connection tube and the loading position of the sample.

9. The sample transfer device of claim 7, wherein the shielding member is arranged between an inner side of an opening in a wall of the sample transfer device leading to the connection tube and the loading position of the sample.

10. The sample transfer device of claim 1, wherein the shielding member is pivotably mounted for rotation about a rotation axis.

11. The sample transfer device of claim 1, wherein the sample transfer device comprises a transfer rod configured to receive a sample holder carrying the sample, the transfer rod being moveable along the transfer path.

12. The sample transfer device of claim 11, wherein the transfer rod comprises a protective cover configured to be placed above the sample carried by the sample holder when the sample holder is received by the transfer rod.

13. The sample transfer device of claim 12, wherein a height of the shielding member is at least equal to a height of the protective cover, the respective heights relating to a same basis in the sample transfer device.

14. The sample transfer device of claim 11, wherein the sample transfer device comprises the sample holder.

15. The sample transfer device of claim 14, wherein the sample holder comprises a sample holding area for receiving the sample and/or a sample carrier, and a first borehole extending through the sample holder in line with the sample holding area.

16. The sample transfer device of claim 15, wherein the sample holder comprises a second borehole configured to receive the transfer rod when the sample holder is in the loading position.

17. The sample transfer device of claim 16, wherein the second borehole is covered by the shielding member when the shielding member is arranged between the connection opening and the loading position to protect the sample from an incoming gas stream.

18. The sample transfer device of claim 14, wherein the sample holder comprises a borehole configured to receive the transfer rod when the sample holder is in the loading position.

19. The sample transfer device of claim 18, wherein the borehole is covered by the shielding member when the shielding member is arranged between the connection opening and the loading position to protect the sample from an incoming gas stream.

* * * * *